US012644969B2

(12) United States Patent
Schleuning et al.

(10) Patent No.: US 12,644,969 B2
(45) Date of Patent: Jun. 2, 2026

(54) THREE TERMINAL BROAD AREA LASER

(71) Applicant: Waymo LLC, Mountain View, CA (US)

(72) Inventors: David Schleuning, Mountain View, CA (US); Pierre-Yves Droz, Mountain View, CA (US); Augusto Tazzoli, Mountain View, CA (US); Vadim Gutnik, Mountain View, CA (US); Pablo Hopman, Mountain View, CA (US)

(73) Assignee: Waymo LLC, Mountain View, CA (US)

( * ) Notice: Subject to any disclaimer, the term of this patent is extended or adjusted under 35 U.S.C. 154(b) by 1175 days.

(21) Appl. No.: 17/516,798

(22) Filed: Nov. 2, 2021

(65) Prior Publication Data

US 2022/0137185 A1 May 5, 2022

Related U.S. Application Data

(60) Provisional application No. 63/108,686, filed on Nov. 2, 2020.

(51) Int. Cl.
| | |
|---|---|
| *H01S 5/06* | (2006.01) |
| *G01S 7/484* | (2006.01) |
| *G01S 17/08* | (2006.01) |
| *G01S 17/931* | (2020.01) |
| *H01S 5/042* | (2006.01) |

(52) U.S. Cl.
CPC .............. *G01S 7/484* (2013.01); *G01S 17/08* (2013.01); *G01S 17/931* (2020.01); *H01S*
*5/0425* (2013.01); *H01S 5/0428* (2013.01); *H01S 5/0602* (2013.01); *H01S 5/0615* (2013.01)

(58) Field of Classification Search
CPC ............................ H01S 5/0602; H01S 5/0615
See application file for complete search history.

(56) References Cited

U.S. PATENT DOCUMENTS

| | | | | |
|---|---|---|---|---|
| 4,055,815 A | * | 10/1977 | Smith ........................ | H01S 5/20 |
| | | | | 372/46.015 |
| 4,562,569 A | * | 12/1985 | Yariv .................... | H01S 5/0601 |
| | | | | 369/120 |

(Continued)

FOREIGN PATENT DOCUMENTS

| | | | | | |
|---|---|---|---|---|---|
| GB | 2437784 A | * | 11/2007 | ........... | H01S 5/0265 |

*Primary Examiner* — Tod T Van Roy
(74) *Attorney, Agent, or Firm* — McDonnell Boehnen Hulbert & Berghoff LLP

(57) ABSTRACT

Example embodiments relate to light detection and ranging (lidar) devices or other apparatus that incorporate laser light emitters capable of increased pulse energies and decreased pulse durations. These laser light emitters include a gain medium having two portions to which a pump electrode and a switch electrode, respectively, are coupled. The pump electrode is configured to apply a current through the gain medium that provides energy for lasing and the switch electrode is configured to apply a current through the gain medium that controls a transparency of the second portion of the gain medium. Thus the switch electrode, which controls the timing of emitted light pulses, can be driven by a lower current and thus have shorter pulse widths, rise time, and/or fall times, thereby allowing for shorter, higher-energy laser pulses to be emitted.

20 Claims, 7 Drawing Sheets

(56) References Cited

U.S. PATENT DOCUMENTS

| | | | | |
|---|---|---|---|---|
| 4,773,076 | A * | 9/1988 | Yamamoto | H01S 5/16 |
| | | | | 372/50.21 |
| 5,033,053 | A * | 7/1991 | Shimizu | H01S 5/06255 |
| | | | | 372/50.121 |
| 5,455,836 | A * | 10/1995 | Li | H01S 5/0608 |
| | | | | 372/75 |
| 6,052,400 | A * | 4/2000 | Nanbu | B82Y 20/00 |
| | | | | 372/18 |
| 7,005,680 | B2 * | 2/2006 | Otsuka | H01S 5/0422 |
| | | | | 257/745 |
| 7,447,246 | B2 * | 11/2008 | He | H01S 5/12 |
| | | | | 372/20 |
| 9,088,127 | B2 * | 7/2015 | Hogg | B82Y 20/00 |
| 10,680,406 | B2 * | 6/2020 | Ono | H01S 5/1017 |
| 11,329,451 | B2 * | 5/2022 | Pannwitz | H01S 5/0615 |
| 11,594,855 | B2 * | 2/2023 | Koyama | H01S 5/0427 |
| 11,682,881 | B2 * | 6/2023 | Shahin | H01S 5/0652 |
| | | | | 359/201.2 |
| 2003/0058906 | A1 * | 3/2003 | Finn | H01S 5/02415 |
| | | | | 372/34 |
| 2019/0288477 | A1 * | 9/2019 | Creeden | H01S 3/094003 |
| 2020/0321748 | A1 * | 10/2020 | Pannwitz | H01S 5/0428 |
| 2021/0281043 | A1 * | 9/2021 | Shahin | H01S 5/0652 |
| 2022/0137185 | A1 * | 5/2022 | Schleuning | H01S 5/0428 |
| | | | | 356/5.01 |
| 2022/0181845 | A1 * | 6/2022 | Zhao | H01S 5/04257 |

* cited by examiner

Figure 7:
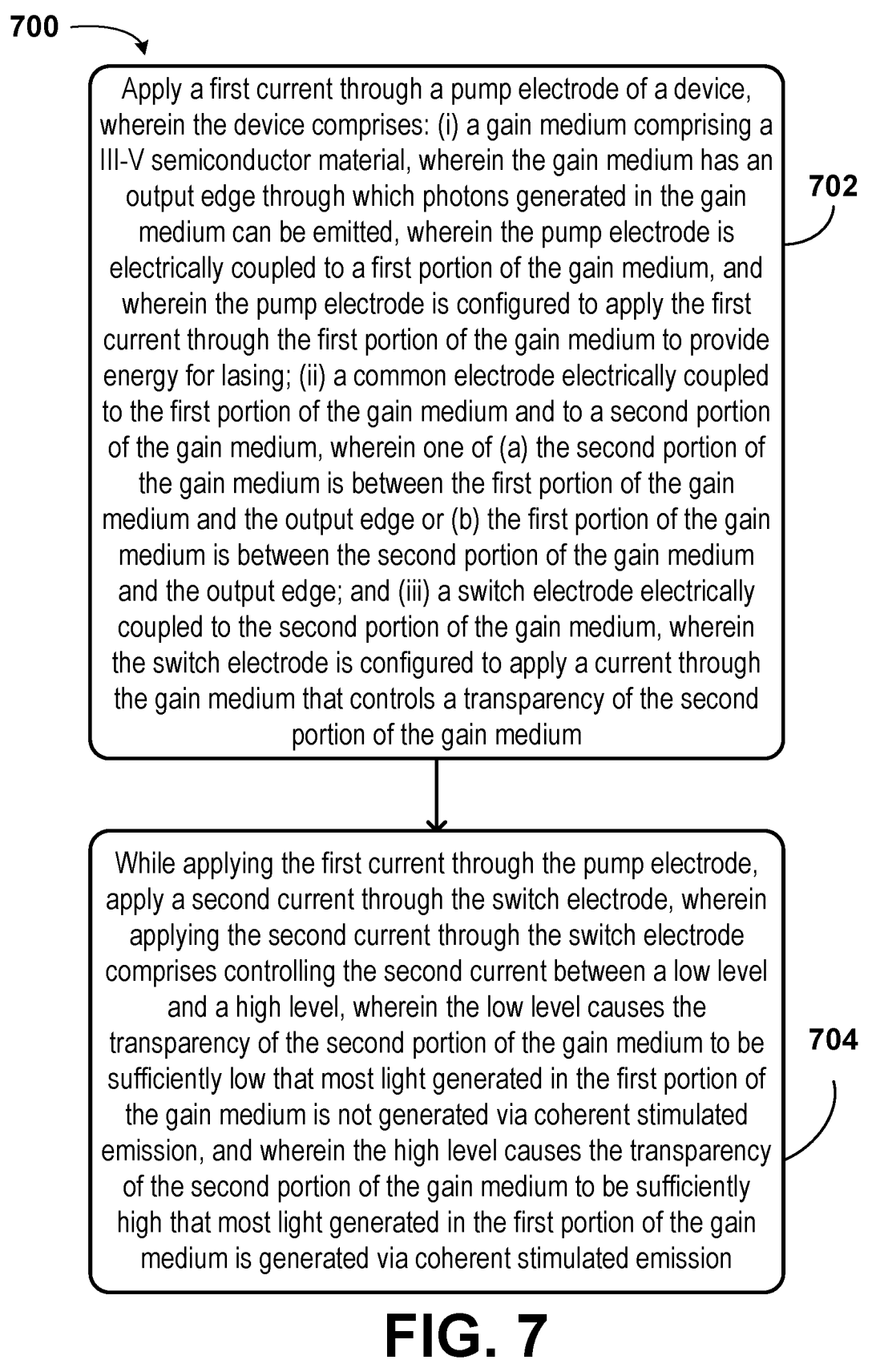

700 —

Apply a first current through a pump electrode of a device, wherein the device comprises: (i) a gain medium comprising a III-V semiconductor material, wherein the gain medium has an output edge through which photons generated in the gain medium can be emitted, wherein the pump electrode is electrically coupled to a first portion of the gain medium, and wherein the pump electrode is configured to apply the first current through the first portion of the gain medium to provide energy for lasing; (ii) a common electrode electrically coupled to the first portion of the gain medium and to a second portion of the gain medium, wherein one of (a) the second portion of the gain medium is between the first portion of the gain medium and the output edge or (b) the first portion of the gain medium is between the second portion of the gain medium and the output edge; and (iii) a switch electrode electrically coupled to the second portion of the gain medium, wherein the switch electrode is configured to apply a current through the gain medium that controls a transparency of the second portion of the gain medium

702

While applying the first current through the pump electrode, apply a second current through the switch electrode, wherein applying the second current through the switch electrode comprises controlling the second current between a low level and a high level, wherein the low level causes the transparency of the second portion of the gain medium to be sufficiently low that most light generated in the first portion of the gain medium is not generated via coherent stimulated emission, and wherein the high level causes the transparency of the second portion of the gain medium to be sufficiently high that most light generated in the first portion of the gain medium is generated via coherent stimulated emission

THREE TERMINAL BROAD AREA LASER

CROSS-REFERENCE TO RELATED APPLICATIONS

The present application claims priority to Provisional Patent Application No. 63/108,686, filed with the U.S. Patent and Trademark Office on Nov. 2, 2020, the contents of which are hereby incorporated by reference.

BACKGROUND

Unless otherwise indicated herein, the materials described in this section are not prior art to the claims in this application and are not admitted to be prior art by inclusion in this section.

Light detection and ranging (lidar) devices may estimate distances to objects in a given environment. For example, an emitter subsystem of a lidar device may emit near-infrared light pulses, which may interact with objects in the device's environment. At least a portion of the light pulses may be redirected back toward the lidar (e.g., due to reflection or scattering) and detected by a detector subsystem. Conventional detector subsystems may include a plurality of detectors and a corresponding controller configured to determine an arrival time of the respective light pulses with high temporal resolution. The distance between the lidar device and a given object may be determined based on a time of flight of the corresponding light pulses that interact with the given object.

In order to improve the accuracy of data generated by such a lidar device, it is desirable that pulses of light emitted from the lidar device have high energy and short pulse widths. In practice, however, increasing the power of a pulse of light emitted by a light pulse emitter of a lidar is generally accompanied by an increase of the width of the emitted pulses.

SUMMARY

A wide variety of applications include the generation of pulses of laser light by a semiconductor laser. These applications include fiber optic communications, laser range finding (e.g., as part of a LIDAR system), laser machining or joining of materials, laser ablation or heating for medical purposes (e.g., to ablate cancerous tumors or other tissues), medical imaging, sample analysis, spectroscopy, or other applications. In many applications, it is desirable to generate very high power, short pulses of laser light. However, generation of such powerful, short pulses using semiconductor lasers is made difficult by the inductance, capacitance, or other time-constant-limiting properties of circuitry driving the semiconductor lasers and/or of the semiconductor lasers themselves.

Embodiments described herein provide for improvements in lasers (e.g., semiconductor lasers) allowing for increased laser pulse energies and reduced pulse durations. These benefits are made possible by including multiple electrodes to drive the gain medium of the semiconductor laser. These electrodes are configured to inject current into respective different regions along the optical axis of the laser. One of the electrodes, a 'pump' electrode, is used to inject a high current into a first region of the gain medium, providing the bulk of the energy that results in the laser pulse. Another electrode, a 'switch' electrode, is operated to switch the laser pulse on and off by controlling the transparency or gain of a second region of the gain medium. Since this switch electrode only needs to inject sufficient current to result in the second region becoming transparent/high gain enough to permit efficient lasing across the entire gain medium, the switch current may be much less (e.g., one or more orders of magnitude less) than the current injected through the pump electrode. Accordingly, the current pulse applied to the switch electrode may be much shorter for a given pulse energy, than if the current for the given pulse energy were to be injected via a single electrode.

In one aspect, a device is provided that includes: (i) a gain medium, wherein the gain medium has an output edge through which photons generated in the gain medium can be emitted; (ii) a common electrode electrically coupled to a first portion of the gain medium and to a second portion of the gain medium, wherein one of (a) the second portion of the gain medium is between the first portion of the gain medium and the output edge or (b) the first portion of the gain medium is between the second portion of the gain medium and the output edge; (iii) a pump electrode electrically coupled to the first portion of the gain medium, wherein the pump electrode is configured to apply a current through the gain medium that provides energy for lasing; and (iv) a switch electrode electrically coupled to the second portion of the gain medium, wherein the switch electrode is configured to apply a current through the gain medium that controls a transparency of the second portion of the gain medium.

In yet another aspect, a method is provided that includes: (i) applying a first current through a pump electrode of a device, wherein the device comprises: (a) a gain medium, optionally comprising a III-V semiconductor material, wherein the gain medium has an output edge through which photons generated in the gain medium can be emitted, wherein the pump electrode is electrically coupled to a first portion of the gain medium, and wherein the pump electrode is configured to apply the first current through the first portion of the gain medium to provide energy for lasing; (b) a common electrode electrically coupled to the first portion of the gain medium and to a second portion of the gain medium, wherein one of (1) the second portion of the gain medium is between the first portion of the gain medium and the output edge or (2) the first portion of the gain medium is between the second portion of the gain medium and the output edge; and (c) a switch electrode electrically coupled to the second portion of the gain medium, wherein the switch electrode is configured to apply a current through the gain medium that controls a transparency of the second portion of the gain medium; and (ii) while applying the first current through the pump electrode, applying a second current through the switch electrode, wherein applying the second current through the switch electrode comprises controlling the second current between a low level and a high level, wherein the low level causes the transparency of the second portion of the gain medium to be sufficiently low that most light generated in the first portion of the gain medium is not generated via coherent stimulated emission, and wherein the high level causes the transparency of the second portion of the gain medium to be sufficiently high that most light generated in the first portion of the gain medium is generated via coherent stimulated emission.

In an additional aspect, a semiconductor laser is provided that includes: (i) a gain medium comprising a III-V semiconductor material, wherein the gain medium has an output edge through which photons generated in the gain medium can be emitted; (ii) a common electrode electrically coupled to a first portion of the gain medium and to a second portion of the gain medium, wherein one of (a) the second portion of the gain medium is between the first portion of the gain medium and the output edge or (b) the first portion of the gain medium is between the second portion of the gain medium and the output edge; (iii) a pump electrode electrically coupled to the first portion of the gain medium, wherein the pump electrode is configured to apply a first current through the first portion of the gain medium, wherein the first current provides energy for lasing; and (iv) a switch electrode electrically coupled to the second portion of the gain medium, wherein the switch electrode is configured to apply a second current through the second portion of the gain medium, wherein the second current controls a transparency of the second portion of the gain medium.

These as well as other aspects, advantages, and alternatives will become apparent to those of ordinary skill in the art by reading the following detailed description with reference where appropriate to the accompanying drawings. Further, it should be understood that the description provided in this summary section and elsewhere in this document is intended to illustrate the claimed subject matter by way of example and not by way of limitation.

BRIEF DESCRIPTION OF THE DRAWINGS

FIG. 7 is an illustration of a method, according to example embodiments.

DETAILED DESCRIPTION

Example methods and systems are contemplated herein. Any example embodiment or feature described herein is not necessarily to be construed as preferred or advantageous over other embodiments or features. The example embodiments described herein are not meant to be limiting. It will be readily understood that certain aspects of the disclosed systems and methods can be arranged and combined in a wide variety of different configurations, all of which are contemplated herein.

Furthermore, the particular arrangements shown in the figures should not be viewed as limiting. It should be understood that other embodiments might include more or less of each element shown in a given figure. Further, some of the illustrated elements may be combined or omitted. Yet further, an example embodiment may include elements that are not illustrated in the figures.

The following description and accompanying drawings will elucidate features of various example embodiments that can include the improved semiconductor lasers described herein. The embodiments provided are by way of example, and are not intended to be limiting. As such, the dimensions of the drawings are not necessarily to scale. Indeed, semiconductor laser devices as described herein could be incorporated into alternatively configured lidar systems that may be included as part of fully or partially autonomous vehicle systems, or as part of some other system(s). Additionally or alternatively, such semiconductor laser devices could be incorporated into non-lidar applications that can be facilitated by lasers capable of generating high energy pulses that exhibit short pulse durations, short pulse rise times, and/or short pulse fall times.

Example systems within the scope of the present disclosure will now be described in greater detail. An example system may be implemented in or may take the form of an automobile. However, an example system may also be implemented in or take the form of other vehicles, such as cars, trucks, motorcycles, buses, boats, airplanes, helicopters, drones, lawn mowers, earth movers, boats, submarines, all terrain vehicles, snowmobiles, aircraft, recreational vehicles, amusement park vehicles, farm equipment or vehicles, construction equipment or vehicles, warehouse equipment or vehicles, factory equipment or vehicles, trams, golf carts, trains, trolleys, sidewalk delivery vehicles, and robot devices. Other vehicles are possible as well. Further, in some embodiments, example systems might not include a vehicle.

Figure 1:
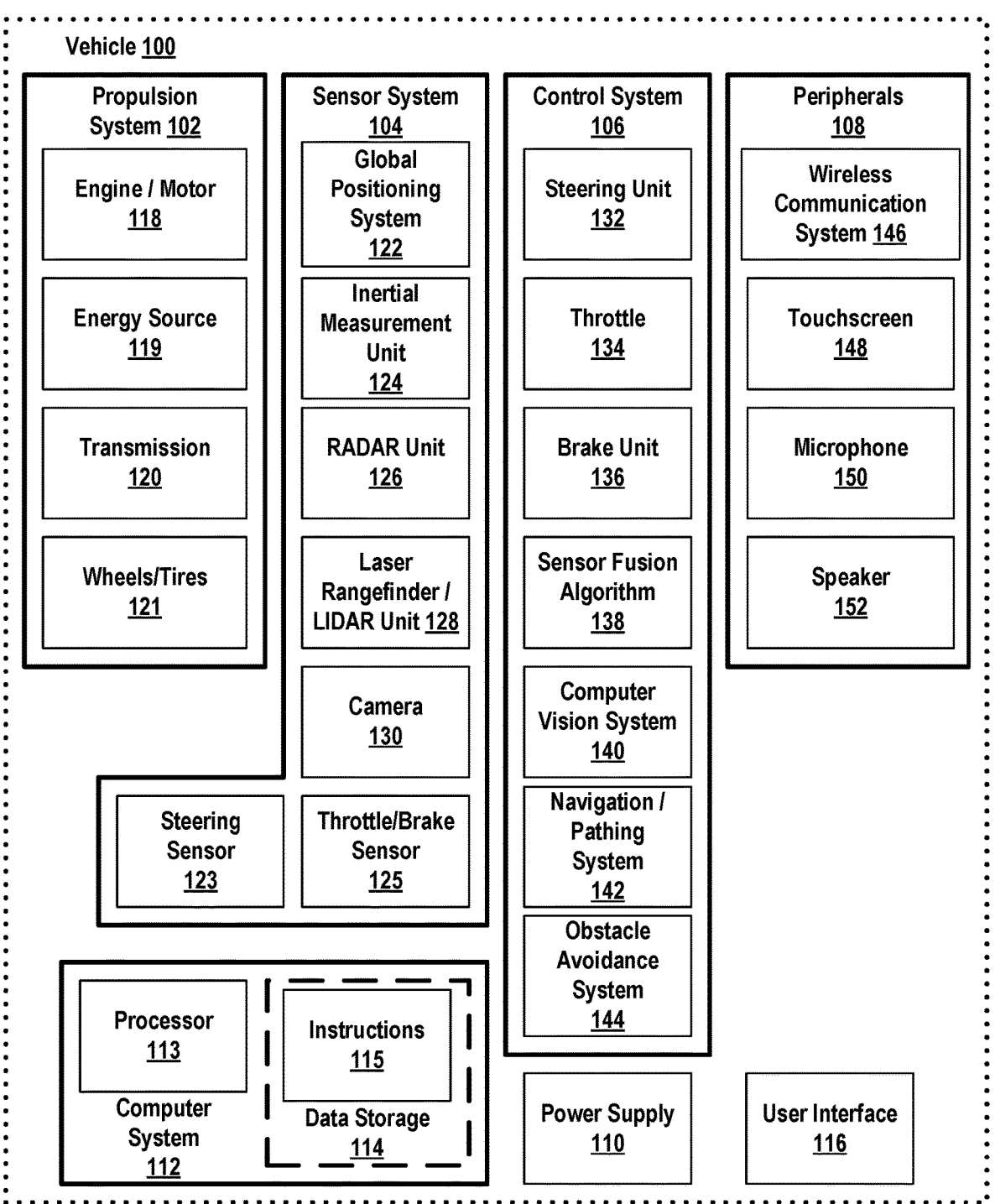
FIG. 1 is a functional block diagram illustrating a vehicle, according to example embodiments.
Figure 2A:
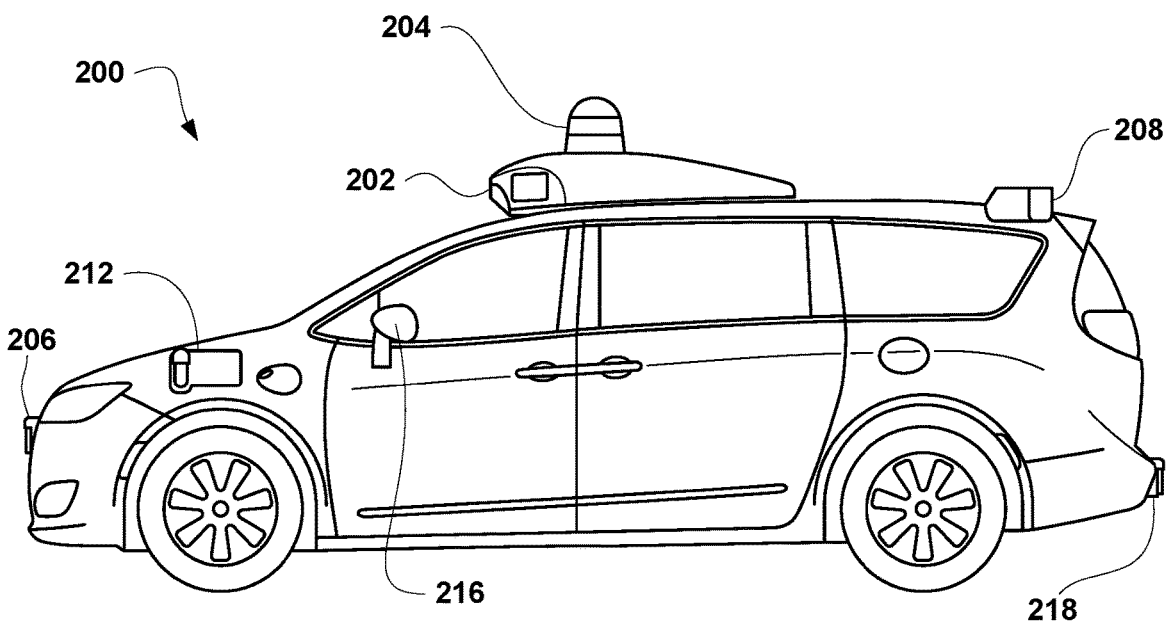
FIG. 2A is an illustration of a physical configuration of a vehicle, according to example embodiments.
Figure 2B:
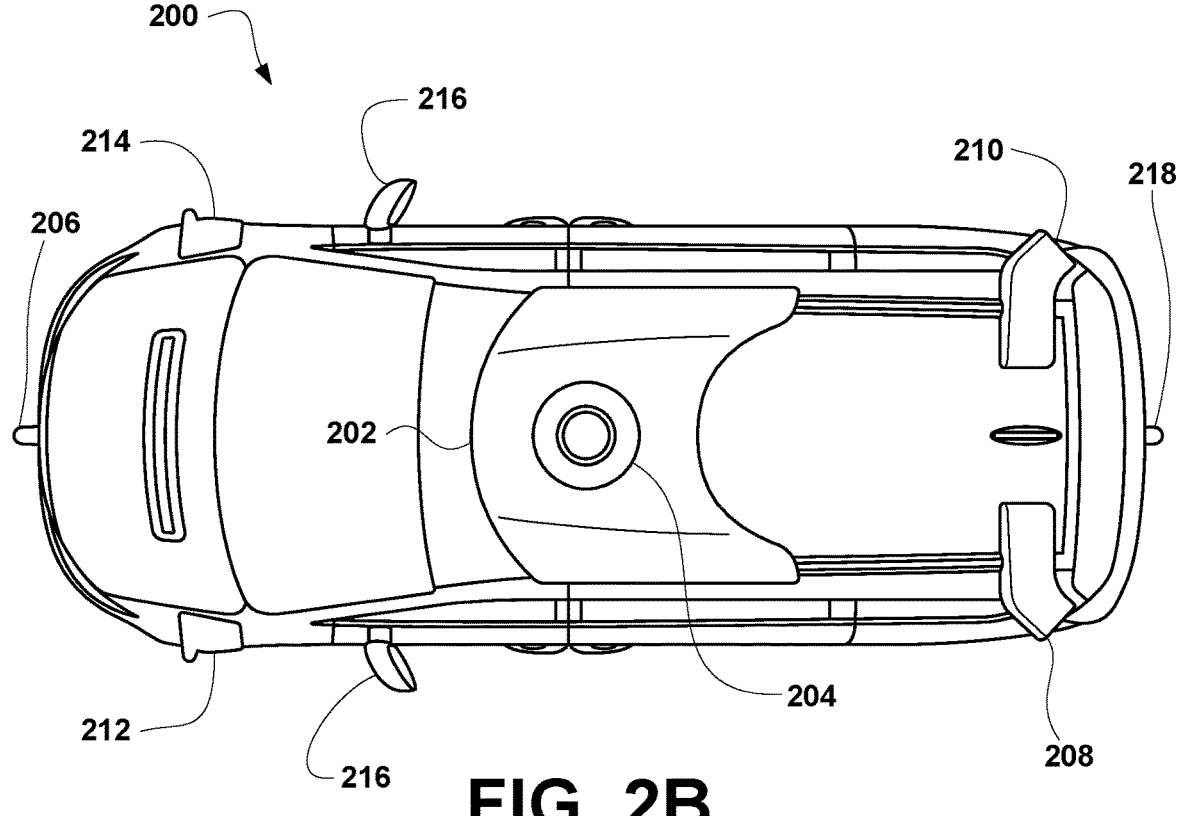
FIG. 2B is an illustration of a physical configuration of a vehicle, according to example embodiments.
Figure 2C:
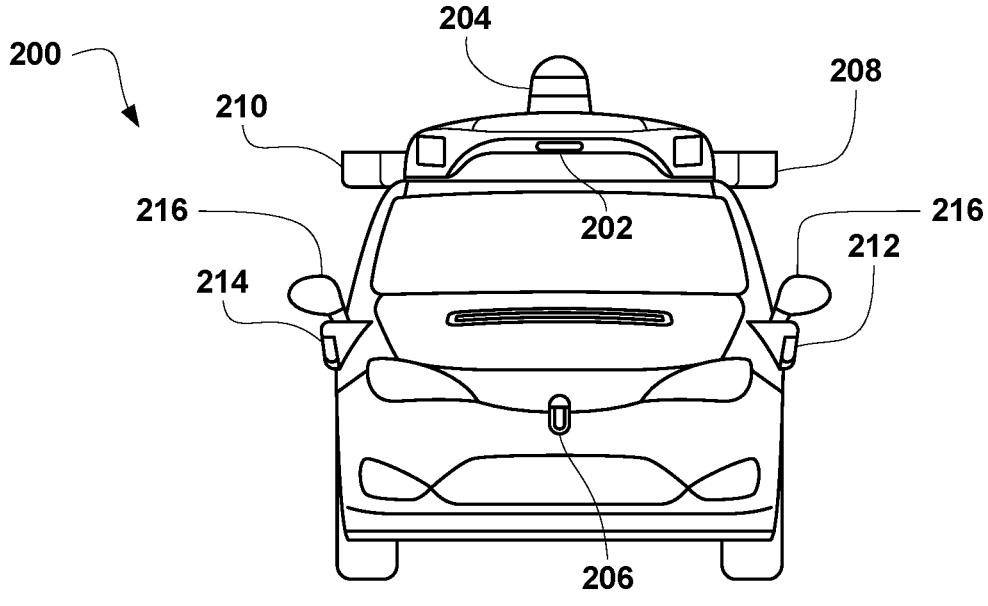
FIG. 2C is an illustration of a physical configuration of a vehicle, according to example embodiments.
Figure 2D:
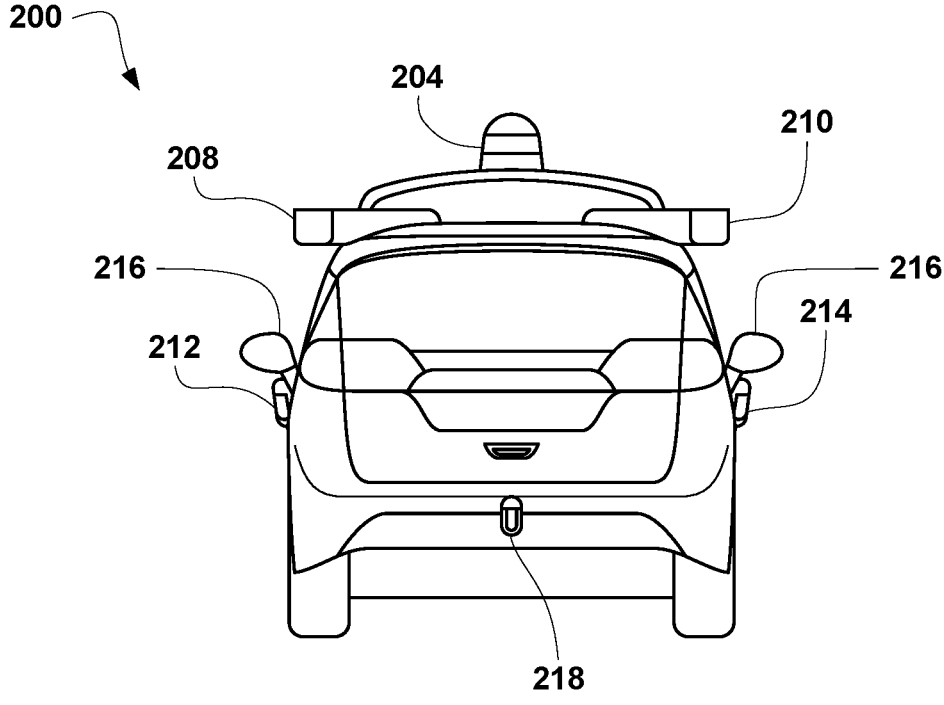
FIG. 2D is an illustration of a physical configuration of a vehicle, according to example embodiments.
Figure 2E:
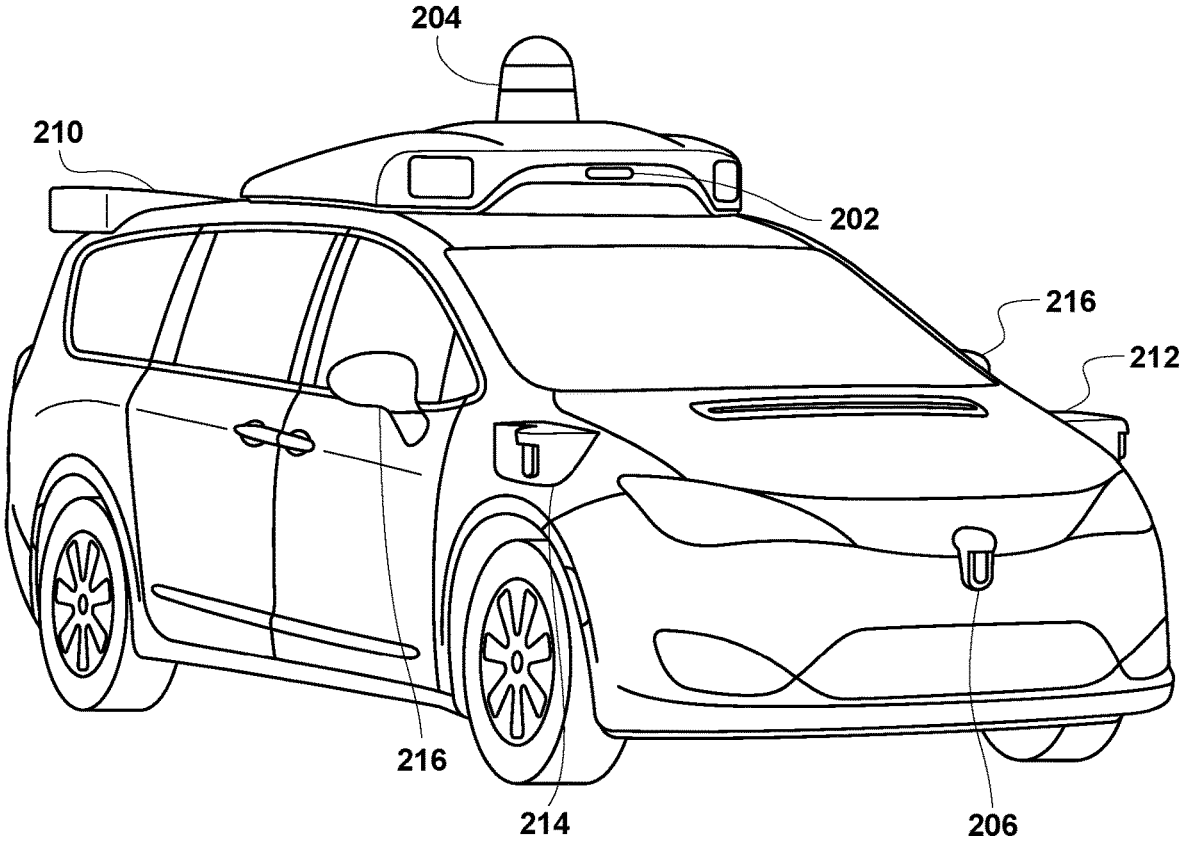
FIG. 2E is an illustration of a physical configuration of a vehicle, according to example embodiments.

Referring now to the figures, FIG. 1 is a functional block diagram illustrating example vehicle 100, which may be configured to operate fully or partially in an autonomous mode. More specifically, vehicle 100 may operate in an autonomous mode without human interaction through receiving control instructions from a computing system. As part of operating in the autonomous mode, vehicle 100 may use sensors to detect and possibly identify objects of the surrounding environment to enable safe navigation. As an example, the surrounding environment could include an interior or exterior environment, such as inside a building or outside of the building. Additionally or alternatively, the surrounding environment could include a vicinity around and/or on a roadway. Examples of objects in the surrounding environment include, but are not limited to, other vehicles, traffic signs, pedestrians, roadway surfaces, buildings, terrain, etc. Additionally, example vehicle 100 may operate in a partially autonomous (i.e., semi-autonomous) mode in which some functions of the vehicle 100 are controlled by a human driver of the vehicle 100 and some functions of the vehicle 100 are controlled by the computing system. For example, vehicle 100 may also include subsystems that enable the driver to control operations of vehicle 100 such as steering, acceleration, and braking, while the computing system performs assistive functions such as lane-departure warnings/lane-keeping assist or adaptive cruise control based on other objects (e.g., vehicles) in the surrounding environment.

As shown in FIG. 1, vehicle 100 may include various subsystems, such as propulsion system 102, sensor system 104, control system 106, one or more peripherals 108, power supply 110, computer system 112 (could also be referred to as a computing system), data storage 114, and user interface 116. In other examples, vehicle 100 may include more or fewer subsystems, which can each include multiple elements. The subsystems and components of vehicle 100 may be interconnected in various ways. In addition, functions of vehicle 100 described herein can be divided into additional functional or physical components, or combined into fewer functional or physical components within embodiments. For instance, the control system 106 and the computer system 112 may be combined into a single system that operates the vehicle 100 in accordance with various operations.

Propulsion system 102 may include one or more components operable to provide powered motion for vehicle 100 and can include an engine/motor 118, an energy source 119, a transmission 120, and wheels/tires 121, among other possible components. For example, engine/motor 118 may be configured to convert energy source 119 into mechanical energy and can correspond to one or a combination of an internal combustion engine, an electric motor, steam engine, or Stirling engine, among other possible options. For instance, in some embodiments, propulsion system 102 may include multiple types of engines and/or motors, such as a gasoline engine and an electric motor.

Energy source 119 represents a source of energy that may, in full or in part, power one or more systems of vehicle 100 (e.g., engine/motor 118). For instance, energy source 119 can correspond to gasoline, diesel, other petroleum-based fuels, propane, other compressed gas-based fuels, ethanol, solar panels, batteries, and/or other sources of electrical power. In some embodiments, energy source 119 may include a combination of fuel tanks, batteries, capacitors, and/or flywheels.

Transmission 120 may transmit mechanical power from engine/motor 118 to wheels/tires 121 and/or other possible systems of vehicle 100. As such, transmission 120 may include a gearbox, a clutch, a differential, and a drive shaft, among other possible components. A drive shaft may include axles that connect to one or more wheels/tires 121.

Wheels/tires 121 of vehicle 100 may have various configurations within example embodiments. For instance, vehicle 100 may exist in a unicycle, bicycle/motorcycle, tricycle, or car/truck four-wheel format, among other possible configurations. As such, wheels/tires 121 may connect to vehicle 100 in various ways and can exist in different materials, such as metal and rubber.

Sensor system 104 can include various types of sensors, such as GPS 122, inertial measurement unit (IMU) 124, radar 126, laser rangefinder/lidar 128, camera 130, steering sensor 123, and throttle/brake sensor 125, among other possible sensors (e.g., microphones, sonar systems, or other acoustic sensors). In some embodiments, sensor system 104 may also include sensors configured to monitor internal systems of the vehicle 100 (e.g., 02 monitor, fuel gauge, engine oil temperature, brake wear).

GPS 122 may include a transceiver operable to provide information regarding the position of vehicle 100 with respect to the Earth. IMU 124 may have a configuration that uses one or more accelerometers and/or gyroscopes and may sense position and orientation changes of vehicle 100 based on inertial acceleration. For example, IMU 124 may detect a pitch and yaw of the vehicle 100 while vehicle 100 is stationary or in motion.

Radar 126 may represent one or more systems configured to use radio signals to sense objects, including the speed and heading of the objects, within the surrounding environment of vehicle 100. As such, radar 126 may include antennas configured to transmit and receive radio signals. In some embodiments, radar 126 may correspond to a mountable radar system configured to obtain measurements of the surrounding environment of vehicle 100.

Laser rangefinder/lidar 128 may include one or more laser sources, a laser scanner, and one or more detectors, among other system components, and may operate in a coherent mode (e.g., using heterodyne detection) or in an incoherent detection mode. In some embodiments, the laser rangefinder/lidar 128 may include one or more semiconductor lasers or other light emitters configured as described herein to provide increased laser pulse energy and decreased laser pulse width, rise time, and/or fall time. In some embodiments, the one or more detectors of the laser rangefinder/lidar 128 may include one or more photodetectors. Such photodetectors may be avalanche photodiodes (APDs). In some examples, such photodetectors may be capable of detecting single photons (e.g., SPADs). Further, such photodetectors can be arranged (e.g., through an electrical connection in series) into an array (e.g., as in a SiPM). In some examples, the one or more photodetectors are Geiger-mode operated devices and the lidar includes subcomponents designed for such Geiger-mode operation.

Camera 130 may include one or more devices (e.g., still camera or video camera, a thermal imaging camera, a stereo camera, a night vision camera, etc.) configured to capture images of the surrounding environment of vehicle 100.

Steering sensor 123 may sense a steering angle of vehicle 100, which may involve measuring an angle of the steering wheel or measuring an electrical signal representative of the angle of the steering wheel. In some embodiments, steering sensor 123 may measure an angle of the wheels of the vehicle 100, such as detecting an angle of the wheels with respect to a forward axis of the vehicle 100. Steering sensor 123 may also be configured to measure a combination (or a subset) of the angle of the steering wheel, electrical signal representing the angle of the steering wheel, and the angle of the wheels of vehicle 100.

Throttle/brake sensor 125 may detect the position of either the throttle position or brake position of vehicle 100. For instance, throttle/brake sensor 125 may measure the angle of both the gas pedal (throttle) and brake pedal or may measure an electrical signal that could represent, for instance, an angle of a gas pedal (throttle) and/or an angle of a brake pedal. Throttle/brake sensor 125 may also measure an angle of a throttle body of vehicle 100, which may include part of the physical mechanism that provides modulation of energy source 119 to engine/motor 118 (e.g., a butterfly valve or carburetor). Additionally, throttle/brake sensor 125 may measure a pressure of one or more brake pads on a rotor of vehicle 100 or a combination (or a subset) of the angle of the gas pedal (throttle) and brake pedal, electrical signal representing the angle of the gas pedal (throttle) and brake pedal, the angle of the throttle body, and the pressure that at least one brake pad is applying to a rotor of vehicle 100. In other embodiments, throttle/brake sensor 125 may be configured to measure a pressure applied to a pedal of the vehicle, such as a throttle or brake pedal.

Control system 106 may include components configured to assist in navigating vehicle 100, such as steering unit 132, throttle 134, brake unit 136, sensor fusion algorithm 138, computer vision system 140, navigation/pathing system 142, and obstacle avoidance system 144. More specifically, steering unit 132 may be operable to adjust the heading of vehicle 100, and throttle 134 may control the operating speed of engine/motor 118 to control the acceleration of vehicle 100. Brake unit 136 may decelerate vehicle 100, which may involve using friction to decelerate wheels/tires 121. In some embodiments, brake unit 136 may convert kinetic energy of wheels/tires 121 to electric current for subsequent use by a system or systems of vehicle 100.

Sensor fusion algorithm 138 may include a Kalman filter, Bayesian network, or other algorithms that can process data from sensor system 104. In some embodiments, sensor fusion algorithm 138 may provide assessments based on incoming sensor data, such as evaluations of individual objects and/or features, evaluations of a particular situation, and/or evaluations of potential impacts within a given situation.

Computer vision system 140 may include hardware and software operable to process and analyze images in an effort to determine objects, environmental objects (e.g., traffic lights, roadway boundaries, etc.), and obstacles. As such, computer vision system 140 may use object recognition, Structure From Motion (SFM), video tracking, and other algorithms used in computer vision, for instance, to recognize objects, map an environment, track objects, estimate the speed of objects, etc.

Navigation/pathing system 142 may determine a driving path for vehicle 100, which may involve dynamically adjusting navigation during operation. As such, navigation/pathing system 142 may use data from sensor fusion algorithm 138, GPS 122, and maps, among other sources to navigate vehicle 100. Obstacle avoidance system 144 may evaluate potential obstacles based on sensor data and cause systems of vehicle 100 to avoid or otherwise negotiate the potential obstacles.

As shown in FIG. 1, vehicle 100 may also include peripherals 108, such as wireless communication system 146, touchscreen 148, microphone 150, and/or speaker 152. Peripherals 108 may provide controls or other elements for a user to interact with user interface 116. For example, touchscreen 148 may provide information to users of vehicle 100. User interface 116 may also accept input from the user via touchscreen 148. Peripherals 108 may also enable vehicle 100 to communicate with devices, such as other vehicle devices.

Wireless communication system 146 may wirelessly communicate with one or more devices directly or via a communication network. For example, wireless communication system 146 could use 3G cellular communication, such as code-division multiple access (CDMA), evolution-data optimized (EVDO), global system for mobile communications (GSM)/general packet radio service (GPRS), or cellular communication, such as 4G worldwide interoperability for microwave access (WiMAX) or long-term evolution (LTE), or 5G. Alternatively, wireless communication system 146 may communicate with a wireless local area network (WLAN) using WIFI® or other possible connections. Wireless communication system 146 may also communicate directly with a device using an infrared link, Bluetooth, or ZigBee, for example. Other wireless protocols, such as various vehicular communication systems, are possible within the context of the disclosure. For example, wireless communication system 146 may include one or more dedicated short-range communications (DSRC) devices that could include public and/or private data communications between vehicles and/or roadside stations.

Vehicle 100 may include power supply 110 for powering components. Power supply 110 may include a rechargeable lithium-ion or lead-acid battery in some embodiments. For instance, power supply 110 may include one or more batteries configured to provide electrical power. Vehicle 100 may also use other types of power supplies. In an example embodiment, power supply 110 and energy source 119 may be integrated into a single energy source.

Vehicle 100 may also include computer system 112 to perform operations, such as operations described therein. As such, computer system 112 may include at least one processor 113 (which could include at least one microprocessor unit, graphics processor unit (GPU), application-specific integrated circuit (ASIC), field-programmable gate array (FPGA), etc.) operable to execute instructions 115 stored in a non-transitory, computer-readable medium, such as data storage 114. In some embodiments, computer system 112 may represent a plurality of computing devices that may serve to control individual components or subsystems of vehicle 100 in a distributed fashion.

In some embodiments, data storage 114 may contain instructions 115 (e.g., program logic) executable by processor 113 to execute various functions of vehicle 100, including those described above in connection with FIG. 1. Data storage 114 may contain additional instructions as well, including instructions to transmit data to, receive data from, interact with, and/or control one or more of propulsion system 102, sensor system 104, control system 106, and peripherals 108.

In addition to instructions 115, data storage 114 may store data such as roadway maps, path information, among other information. Such information may be used by vehicle 100 and computer system 112 during the operation of vehicle 100 in the autonomous, semi-autonomous, and/or manual modes.

Vehicle 100 may include user interface 116 for providing information to or receiving input from a user of vehicle 100. User interface 116 may control or enable control of content and/or the layout of interactive images that could be displayed on touchscreen 148. Further, user interface 116 could include one or more input/output devices within the set of peripherals 108, such as wireless communication system 146, touchscreen 148, microphone 150, and speaker 152.

Computer system 112 may control the function of vehicle 100 based on inputs received from various subsystems (e.g., propulsion system 102, sensor system 104, and control system 106), as well as from user interface 116. For example, computer system 112 may utilize input from sensor system 104 in order to estimate the output produced by propulsion system 102 and control system 106. Depending upon the embodiment, computer system 112 could be operable to monitor many aspects of vehicle 100 and its subsystems. In some embodiments, computer system 112 may disable some or all functions of the vehicle 100 based on signals received from sensor system 104.

The components of vehicle 100 could be configured to work in an interconnected fashion with other components within or outside their respective systems. For instance, in an example embodiment, camera 130 could capture a plurality of images that could represent information about a state of a surrounding environment of vehicle 100 operating in an autonomous or semi-autonomous mode. The state of the surrounding environment could include parameters of the road on which the vehicle is operating. For example, computer vision system 140 may be able to recognize the slope (grade) or other features based on the plurality of images of a roadway. Additionally, the combination of GPS 122 and the features recognized by computer vision system 140 may be used with map data stored in data storage 114 to determine specific road parameters. Further, radar 126 and/or laser rangefinder/lidar 128 and/or some other environmental mapping, ranging, and/or positioning sensor system may also provide information about the surroundings of the vehicle.

In other words, a combination of various sensors (which could be termed input-indication and output-indication sensors) and computer system 112 could interact to provide an indication of an input provided to control a vehicle or an indication of the surroundings of a vehicle.

In some embodiments, computer system 112 may make a determination about various objects based on data that is provided by systems other than the radio system. For example, vehicle 100 may have lasers or other optical sensors configured to sense objects in a field of view of the vehicle. Computer system 112 may use the outputs from the various sensors to determine information about objects in a field of view of the vehicle, and may determine distance and direction information to the various objects. Computer system 112 may also determine whether objects are desirable or undesirable based on the outputs from the various sensors.

Although FIG. 1 shows various components of vehicle 100 (i.e., wireless communication system 146, computer system 112, data storage 114, and user interface 116) as being integrated into the vehicle 100, one or more of these components could be mounted or associated separately from vehicle 100. For example, data storage 114 could, in part or in full, exist separate from vehicle 100. Thus, vehicle 100 could be provided in the form of device elements that may be located separately or together. The device elements that make up vehicle 100 could be communicatively coupled together in a wired and/or wireless fashion.

FIGS. 2A-2E shows an example vehicle 200 (e.g., a fully autonomous vehicle or semi-autonomous vehicle) that can include some or all of the functions described in connection with vehicle 100 in reference to FIG. 1. Although vehicle 200 is illustrated in FIGS. 2A-2E as a van with side view mirrors 216 for illustrative purposes, the present disclosure is not so limited. For instance, the vehicle 200 can represent a truck, a car, a semi-trailer truck, a motorcycle, a golf cart, an off-road vehicle, a farm vehicle, or any other vehicle that is described elsewhere herein (e.g., or any other vehicle that is described elsewhere herein (e.g., buses, boats, airplanes, helicopters, drones, lawn mowers, earth movers, submarines, all-terrain vehicles, snowmobiles, aircraft, recreational vehicles, amusement park vehicles, farm equipment, construction equipment or vehicles, warehouse equipment or vehicles, factory equipment or vehicles, trams, trains, trolleys, sidewalk delivery vehicles, and robot devices, etc.).

The example vehicle 200 may include one or more sensor systems 202, 204, 206, 208, 210, 212, 214, and 218. In some embodiments, sensor systems 202, 204, 206, 208, 210, 212, 214, and/or 218 could represent one or more optical systems (e.g. cameras, etc.), one or more lidars, one or more radars, one or more range finders, one or more inertial sensors, one or more humidity sensors, one or more acoustic sensors (e.g., microphones, sonar devices, etc.), and/or one or more other sensors configured to sense information about an environment surrounding the vehicle 200. In other words, any sensor system described elsewhere herein could be coupled to the vehicle 200 and/or could be utilized in conjunction with various operations of the vehicle 200. As an example, a lidar system could be utilized in self-driving or other types of navigation, planning, perception, and/or mapping operations of the vehicle 200. In addition, systems 202, 204, 206, 208, 210, 212, 214, and/or 218 could represent a combination of sensors described herein (e.g., one or more lidars and radars, one or more lidars and cameras, one or more cameras and radars, etc.).

In some examples, the sensor systems could be disposed in various other locations on the vehicle 200 and could have fields of view that correspond to internal and/or surrounding environments of the vehicle 200. While the one or more sensor systems 202, 204, 206, 208, 210, 212, 214, and 218 are illustrated on certain locations on vehicle 200, it will be understood that more or fewer sensor systems could be utilized with vehicle 200. Further, the locations of such sensor systems could be adjusted, modified, or otherwise changed as compared to the locations of the sensor systems illustrated in FIGS. 2A-2E.

The one or more sensor systems 202, 204, 206, 208, 210, 212, 214, and/or 218 could include one or more lidar sensors. For example, the lidar sensors could include a plurality of light-emitter devices arranged over a range of angles with respect to a given plane (e.g., the x-y plane). For example, one or more of the sensor systems 202, 204, 206, 208, 210, 212, 214, and/or 218 may be configured to rotate or pivot about an axis (e.g., the z-axis) perpendicular to the given plane so as to illuminate an environment surrounding the vehicle 200 with light pulses. Based on detecting various aspects of reflected light pulses (e.g., the elapsed time of flight, polarization, intensity, etc.), information about the surrounding environment may be determined.

In an example embodiment, sensor systems 202, 204, 206, 208, 210, 212, 214, and/or 218 may be configured to provide respective point cloud information that may relate to physical objects within the surrounding environment of the vehicle 200. While vehicle 200 and sensor systems 202, 204, 206, 208, 210, 212, 214, and 218 are illustrated as including certain features, it will be understood that other types of sensor systems are contemplated within the scope of the present disclosure. Further, the example vehicle 200 can include any of the components described in connection with vehicle 100 of FIG. 1.

Note that the number, location, and type of sensor units (e.g., 202, 204, etc.) depicted in FIGS. 2A-E are intended as a non-limiting example of the location, number, and type of such sensor units of an autonomous or semi-autonomous vehicle. Alternative numbers, locations, types, and configurations of such sensors are possible (e.g., to comport with vehicle size, shape, aerodynamics, fuel economy, aesthetics, or other conditions, to reduce cost, to adapt to specialized environmental or application circumstances, etc.).

The sensor unit 202 is mounted atop the vehicle 200 and includes one or more sensors configured to detect information about an environment surrounding the vehicle 200, and output indications of the information. For example, sensor unit 202 can include any combination of cameras, radars, lidars, range finders, inertial sensors, humidity sensors, and acoustic sensors (e.g., microphones, sonar devices, etc.). The sensor unit 202 can include one or more movable mounts that could be operable to adjust the orientation of one or more sensors in the sensor unit 202. In one embodiment, the movable mount could include a rotating platform that could scan sensors so as to obtain information from each direction around the vehicle 200. In another embodiment, the movable mount of the sensor unit 202 could be movable in a scanning fashion within a particular range of angles and/or azimuths and/or elevations. The sensor unit 202 could be mounted atop the roof of a car, although other mounting locations are possible.

Additionally, the sensors of sensor unit 202 could be distributed in different locations and need not be collocated in a single location. Furthermore, each sensor of sensor unit 202 can be configured to be moved or scanned independently of other sensors of sensor unit 202. Additionally or alternatively, multiple sensors may be mounted at one or more of the sensor locations 202, 204, 206, 208, 210, 212, 214, and or 218. For example, there may be two lidar devices mounted at a sensor location and/or there may be one lidar device and one radar mounted at sensor location.

In an example configuration, one or more radars can be located on vehicle 200. For example, one or more sensor systems 202, 204, 206, 208, 210, 212, 214, and/or 218 could include one or more radars. In some examples, one or more radars can be located near the rear of the vehicle 200 (e.g., sensor systems 208, 210, etc.), to actively scan the environment near the back of the vehicle 200 for the presence of radio-reflective objects. Similarly, one or more radars can be located near the front of the vehicle 200 (e.g., sensor systems 212, 214, etc.) to actively scan the environment near the front of the vehicle 200. A radar can be situated, for example, in a location suitable to illuminate a region including a forward-moving path of the vehicle 200 without occlusion by other features of the vehicle 200. For example, a radar can be embedded in and/or mounted in or near the front bumper, front headlights, cowl, and/or hood, etc. Furthermore, one or more additional radars can be located to actively scan the side and/or rear of the vehicle 200 for the presence of radio-reflective objects, such as by including such devices in or near the rear bumper, side panels, rocker panels, and/or undercarriage, etc.

Although not shown in FIGS. 2A-2E, the vehicle 200 can include a wireless communication system. The wireless communication system may include wireless transmitters and receivers that could be configured to communicate with devices external or internal to the vehicle 200. Specifically, the wireless communication system could include transceivers configured to communicate with other vehicles and/or computing devices, for instance, in a vehicular communication system or a roadway station. Examples of such vehicular communication systems include DSRC, radio frequency identification (RFID), and other proposed communication standards directed towards intelligent transport systems.

The vehicle 200 can include one or more cameras. For example, the one or more sensor systems 202, 204, 206, 208, 210, 212, 214, and/or 218 could include one or more cameras. The camera can be a photosensitive instrument, such as a still camera, a video camera, a thermal imaging camera, a stereo camera, a night vision camera, etc., that is configured to capture a plurality of images of the surrounding environment of the vehicle 200. To this end, the camera can be configured to detect visible light, and can additionally or alternatively be configured to detect light from other portions of the spectrum, such as infrared or ultraviolet light. The camera can be a two-dimensional detector, and can optionally have a three-dimensional spatial range of sensitivity. In some embodiments, the camera can include, for example, a range detector configured to generate a two-dimensional image indicating distance from the camera to a number of points in the surrounding environment. To this end, the camera may use one or more range detecting techniques. For example, the camera can provide range information by using a structured light technique in which the vehicle 200 illuminates an object in the surrounding environment with a predetermined light pattern, such as a grid or checkerboard pattern and uses the camera to detect a reflection of the predetermined light pattern from environmental surroundings. Based on distortions in the reflected light pattern, the vehicle 200 can determine the distance to the points on the object. The predetermined light pattern may comprise infrared light, or radiation at other suitable wavelengths for such measurements. In some examples, the camera can be mounted inside a front windshield of the vehicle 200. Specifically, the camera can be situated to capture images from a forward-looking view with respect to the orientation of the vehicle 200. Other mounting locations and viewing angles of camera can also be used, either inside or outside the vehicle 200. Further, the camera can have associated optics operable to provide an adjustable field of view. Still further, the camera can be mounted to vehicle 200 with a movable mount to vary a pointing angle of the camera, such as via a pan/tilt mechanism.

The vehicle 200 may include one or more other components in addition to or instead of those shown. The additional components may include electrical or mechanical functionality.

A control system of the vehicle 200 may be configured to control the vehicle 200 in accordance with a control strategy from among multiple possible control strategies. The control system may be configured to receive information from sensors coupled to the vehicle 200 (on or off the vehicle 200), modify the control strategy (and an associated driving behavior) based on the information, and control the vehicle 200 in accordance with the modified control strategy. The control system further may be configured to monitor the information received from the sensors, and continuously evaluate driving conditions; and also may be configured to modify the control strategy and driving behavior based on changes in the driving conditions.

Figure 3:
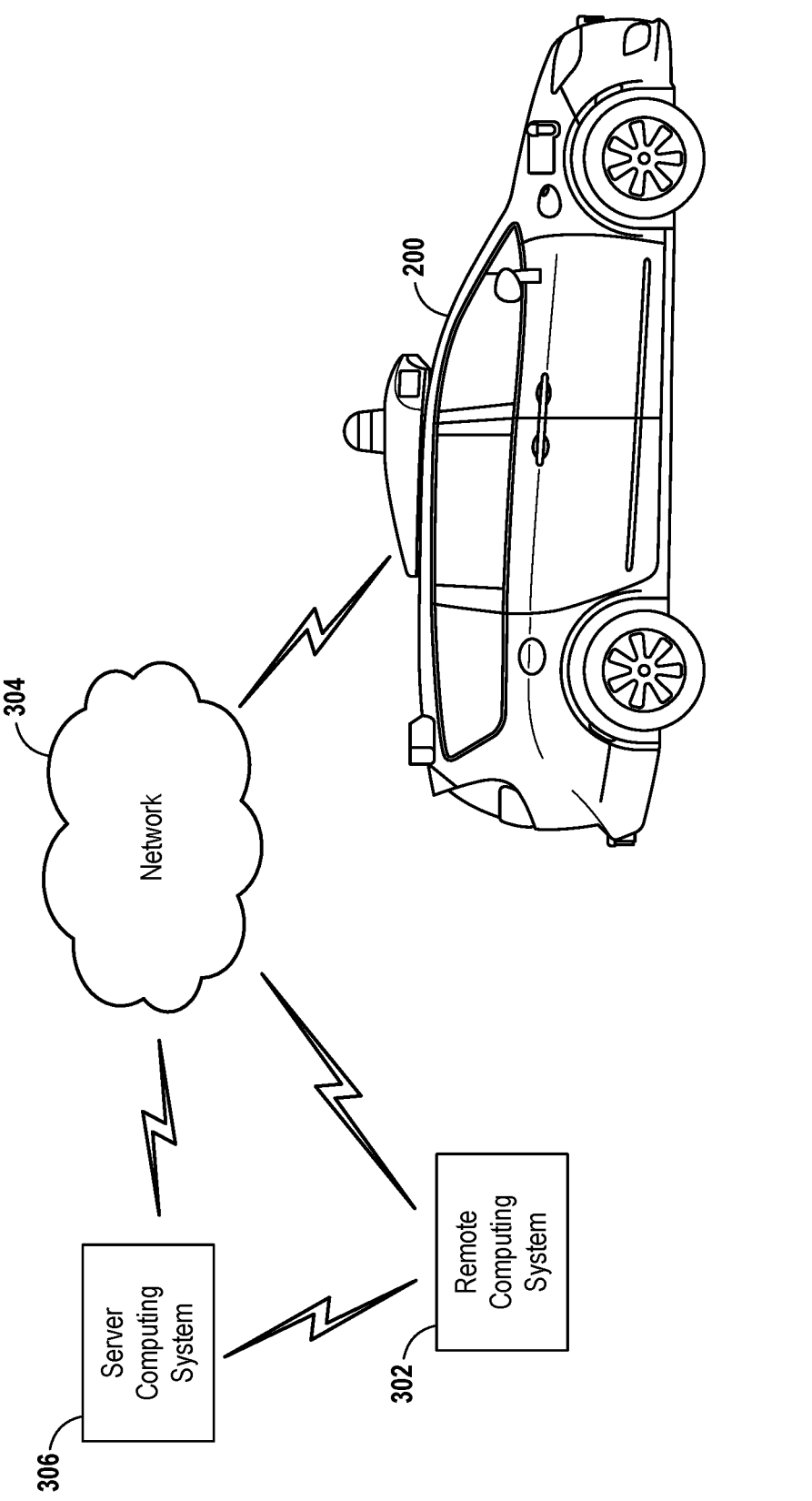
FIG. 3 is a conceptual illustration of wireless communication between various computing systems related to an autonomous vehicle, according to example embodiments.

FIG. 3 is a conceptual illustration of wireless communication between various computing systems related to an autonomous vehicle, according to example embodiments. In particular, wireless communication may occur between remote computing system 302 and vehicle 200 via network 304. Wireless communication may also occur between server computing system 306 and remote computing system 302, and between server computing system 306 and vehicle 200.

Vehicle 200 can correspond to various types of vehicles capable of transporting passengers or objects between locations, and may take the form of any one or more of the vehicles discussed above. In some instances, vehicle 200 may operate in an autonomous mode that enables a control system to safely navigate vehicle 200 between destinations using sensor measurements. When operating in an autonomous mode, vehicle 200 may navigate with or without passengers. As a result, vehicle 200 may pick up and drop off passengers between desired destinations.

Remote computing system 302 may represent any type of device related to remote assistance techniques, including but not limited to those described herein. Within examples, remote computing system 302 may represent any type of device configured to (i) receive information related to vehicle 200, (ii) provide an interface through which a human operator can in turn perceive the information and input a response related to the information, and (iii) transmit the response to vehicle 200 or to other devices. Remote computing system 302 may take various forms, such as a workstation, a desktop computer, a laptop, a tablet, a mobile phone (e.g., a smart phone), and/or a server. In some examples, remote computing system 302 may include multiple computing devices operating together in a network configuration.

Remote computing system 302 may include one or more subsystems and components similar or identical to the subsystems and components of vehicle 200. At a minimum, remote computing system 302 may include a processor configured for performing various operations described herein. In some embodiments, remote computing system 302 may also include a user interface that includes input/output devices, such as a touchscreen and a speaker. Other examples are possible as well.

Network 304 represents infrastructure that enables wireless communication between remote computing system 302 and vehicle 200. Network 304 also enables wireless communication between server computing system 306 and remote computing system 302, and between server computing system 306 and vehicle 200.

The position of remote computing system 302 can vary within examples. For instance, remote computing system 302 may have a remote position from vehicle 200 that has a wireless communication via network 304. In another example, remote computing system 302 may correspond to a computing device within vehicle 200 that is separate from vehicle 200, but with which a human operator can interact while a passenger or driver of vehicle 200. In some examples, remote computing system 302 may be a computing device with a touchscreen operable by the passenger of vehicle 200.

In some embodiments, operations described herein that are performed by remote computing system 302 may be additionally or alternatively performed by vehicle 200 (i.e., by any system(s) or subsystem(s) of vehicle 200). In other words, vehicle 200 may be configured to provide a remote assistance mechanism with which a driver or passenger of the vehicle can interact.

Server computing system 306 may be configured to wirelessly communicate with remote computing system 302 and vehicle 200 via network 304 (or perhaps directly with remote computing system 302 and/or vehicle 200). Server computing system 306 may represent any computing device configured to receive, store, determine, and/or send information relating to vehicle 200 and the remote assistance thereof. As such, server computing system 306 may be configured to perform any operation(s), or portions of such operation(s), that is/are described herein as performed by remote computing system 302 and/or vehicle 200. Some embodiments of wireless communication related to remote assistance may utilize server computing system 306, while others may not.

Server computing system 306 may include one or more subsystems and components similar or identical to the subsystems and components of remote computing system 302 and/or vehicle 200, such as a processor configured for performing various operations described herein, and a wireless communication interface for receiving information from, and providing information to, remote computing system 302 and vehicle 200.

The various systems described above may perform various operations. These operations and related features will now be described.

In line with the discussion above, a computing system (e.g., remote computing system 302, server computing system 306, or a computing system local to vehicle 200) may operate to use a camera to capture images of the surrounding environment of an autonomous vehicle. In general, at least one computing system will be able to analyze the images and possibly control the autonomous vehicle.

In some embodiments, to facilitate autonomous operation a vehicle (e.g., vehicle 200) may receive data representing objects in a surrounding environment in which the vehicle operates (also referred to herein as "environment data") in a variety of ways. A sensor system on the vehicle may provide the environment data representing objects of the surrounding environment. For example, the vehicle may have various sensors, including a camera, a radar unit, a laser range finder, a microphone, a radio unit, and other sensors. Each of these sensors may communicate environment data to a processor in the vehicle about information each respective sensor receives.

In one example, a camera may be configured to capture still images and/or video. In some embodiments, the vehicle may have more than one camera positioned in different orientations. Also, in some embodiments, the camera may be able to move to capture images and/or video in different directions. The camera may be configured to store captured images and video to a memory for later processing by a processing system of the vehicle. The captured images and/or video may be the environment data. Further, the camera may include an image sensor as described herein.

In another example, a radar unit may be configured to transmit an electromagnetic signal that will be reflected by various objects near the vehicle, and then capture electromagnetic signals that reflect off the objects. The captured reflected electromagnetic signals may enable the radar system (or processing system) to make various determinations about objects that reflected the electromagnetic signal. For example, the distances to and positions of various reflecting objects may be determined. In some embodiments, the vehicle may have more than one radar in different orientations. The radar system may be configured to store captured information to a memory for later processing by a processing system of the vehicle. The information captured by the radar system may be environment data.

In another example, a laser range finder may be configured to transmit an electromagnetic signal (e.g., infrared light, such as that from a gas or diode laser, or other possible light source) that will be reflected by target objects near the vehicle. The laser range finder may be able to capture the reflected electromagnetic (e.g., laser) signals. The captured reflected electromagnetic signals may enable the range-finding system (or processing system) to determine a range to various objects. The laser range finder may also be able to determine a velocity or speed of target objects and store it as environment data.

Additionally, in an example, a microphone may be configured to capture audio of the environment surrounding the vehicle. Sounds captured by the microphone may include emergency vehicle sirens and the sounds of other vehicles. For example, the microphone may capture the sound of the siren of an ambulance, fire engine, or police vehicle. A processing system may be able to identify that the captured audio signal is indicative of an emergency vehicle. In another example, the microphone may capture the sound of an exhaust of another vehicle, such as that from a motorcycle. A processing system may be able to identify that the captured audio signal is indicative of a motorcycle. The data captured by the microphone may form a portion of the environment data.

In yet another example, the radio unit may be configured to transmit an electromagnetic signal that may take the form of a Bluetooth signal, 802.11 signal, and/or other radio technology signal. The first electromagnetic radiation signal may be transmitted via one or more antennas located in a radio unit. Further, the first electromagnetic radiation signal may be transmitted with one of many different radio-signaling modes. However, in some embodiments it is desirable to transmit the first electromagnetic radiation signal with a signaling mode that requests a response from devices located near the autonomous vehicle. The processing system may be able to detect nearby devices based on the responses communicated back to the radio unit and use this communicated information as a portion of the environment data.

In some embodiments, the processing system may be able to combine information from the various sensors in order to make further determinations of the surrounding environment of the vehicle. For example, the processing system may combine data from both radar information and a captured image to determine if another vehicle or pedestrian is in front of the autonomous vehicle. In other embodiments, other combinations of sensor data may be used by the processing system to make determinations about the surrounding environment.

While operating in an autonomous mode (or semi-autonomous mode), the vehicle may control its operation with little-to-no human input. For example, a human-operator may enter an address into the vehicle and the vehicle may then be able to drive, without further input from the human (e.g., the human does not have to steer or touch the brake/gas pedals), to the specified destination. Further, while the vehicle is operating autonomously, the sensor system may be receiving environment data. The processing system of the vehicle may alter the control of the vehicle based on environment data received from the various sensors. In some examples, the vehicle may alter a velocity of the vehicle in response to environment data from the various sensors. The vehicle may change velocity in order to avoid obstacles, obey traffic laws, etc. When a processing system in the vehicle identifies objects near the vehicle, the vehicle may be able to change velocity, or alter the movement in another way.

When the vehicle detects an object but is not highly confident in the detection of the object, the vehicle can request a human operator (or a more powerful computer) to perform one or more remote assistance tasks, such as (i) confirm whether the object is in fact present in the surrounding environment (e.g., if there is actually a stop sign or if there is actually no stop sign present), (ii) confirm whether the vehicle's identification of the object is correct, (iii) correct the identification if the identification was incorrect and/or (iv) provide a supplemental instruction (or modify a present instruction) for the autonomous vehicle. Remote assistance tasks may also include the human operator providing an instruction to control operation of the vehicle (e.g., instruct the vehicle to stop at a stop sign if the human operator determines that the object is a stop sign), although in some scenarios, the vehicle itself may control its own operation based on the human operator's feedback related to the identification of the object.

To facilitate this, the vehicle may analyze the environment data representing objects of the surrounding environment to determine at least one object having a detection confidence below a threshold. A processor in the vehicle may be configured to detect various objects of the surrounding environment based on environment data from various sensors. For example, in one embodiment, the processor may be configured to detect objects that may be important for the vehicle to recognize. Such objects may include pedestrians, street signs, other vehicles, indicator signals on other vehicles, and other various objects detected in the captured environment data.

The detection confidence may be indicative of a likelihood that the determined object is correctly identified in the surrounding environment, or is present in the surrounding environment. For example, the processor may perform object detection of objects within image data in the received environment data, and determine that the at least one object has the detection confidence below the threshold based on being unable to identify the object with a detection confidence above the threshold. If a result of an object detection or object recognition of the object is inconclusive, then the detection confidence may be low or below the set threshold.

The vehicle may detect objects of the surrounding environment in various ways depending on the source of the environment data. In some embodiments, the environment data may come from a camera and be image or video data. In other embodiments, the environment data may come from a lidar unit. The vehicle may analyze the captured image or video data to identify objects in the image or video data. The methods and apparatuses may be configured to monitor image and/or video data for the presence of objects of the surrounding environment. In other embodiments, the environment data may be radar, audio, or other data. The vehicle may be configured to identify objects of the surrounding environment based on the radar, audio, or other data.

In some embodiments, the techniques the vehicle uses to detect objects may be based on a set of known data. For example, data related to environmental objects may be stored to a memory located in the vehicle. The vehicle may compare received data to the stored data to determine objects. In other embodiments, the vehicle may be configured to determine objects based on the context of the data. For example, street signs related to construction may generally have an orange color. Accordingly, the vehicle may be configured to detect objects that are orange, and located near the side of roadways as construction-related street signs. Additionally, when the processing system of the vehicle detects objects in the captured data, it also may calculate a confidence for each object.

Further, the vehicle may also have a confidence threshold. The confidence threshold may vary depending on the type of object being detected. For example, the confidence threshold may be lower for an object that may require a quick responsive action from the vehicle, such as brake lights on another vehicle. However, in other embodiments, the confidence threshold may be the same for all detected objects. When the confidence associated with a detected object is greater than the confidence threshold, the vehicle may assume the object was correctly recognized and responsively adjust the control of the vehicle based on that assumption.

When the confidence associated with a detected object is less than the confidence threshold, the actions that the vehicle takes may vary. In some embodiments, the vehicle may react as if the detected object is present despite the low confidence level. In other embodiments, the vehicle may react as if the detected object is not present.

When the vehicle detects an object of the surrounding environment, it may also calculate a confidence associated with the specific detected object. The confidence may be calculated in various ways depending on the embodiment. In one example, when detecting objects of the surrounding environment, the vehicle may compare environment data to predetermined data relating to known objects. The closer the match between the environment data and the predetermined data, the higher the confidence. In other embodiments, the vehicle may use mathematical analysis of the environment data to determine the confidence associated with the objects.

In response to determining that an object has a detection confidence that is below the threshold, the vehicle may transmit, to the remote computing system, a request for remote assistance with the identification of the object. As discussed above, the remote computing system may take various forms. For example, the remote computing system may be a computing device within the vehicle that is separate from the vehicle, but with which a human operator can interact while a passenger or driver of the vehicle, such as a touchscreen interface for displaying remote assistance information. Additionally or alternatively, as another example, the remote computing system may be a remote computer terminal or other device that is located at a location that is not near the vehicle.

The request for remote assistance may include the environment data that includes the object, such as image data, audio data, etc. The vehicle may transmit the environment data to the remote computing system over a network (e.g., network 304), and in some embodiments, via a server (e.g., server computing system 306). The human operator of the remote computing system may in turn use the environment data as a basis for responding to the request.

In some embodiments, when the object is detected as having a confidence below the confidence threshold, the object may be given a preliminary identification, and the vehicle may be configured to adjust the operation of the vehicle in response to the preliminary identification. Such an adjustment of operation may take the form of stopping the vehicle, switching the vehicle to a human-controlled mode, changing a velocity of vehicle (e.g., a speed and/or direction), among other possible adjustments.

In other embodiments, even if the vehicle detects an object having a confidence that meets or exceeds the threshold, the vehicle may operate in accordance with the detected object (e.g., come to a stop if the object is identified with high confidence as a stop sign), but may be configured to request remote assistance at the same time as (or at a later time from) when the vehicle operates in accordance with the detected object.

It is desirable in many applications to generate very high power, short pulses of laser light. However, generation of such powerful, short pulses using semiconductor lasers is made difficult by the inductance, capacitance, or other time-constant-limiting properties of circuitry driving the semiconductor lasers and/or of the semiconductor lasers themselves. Lasers (e.g., semiconductor lasers) described herein include improvements that allow for increased laser pulse energies and reduced pulse durations. These improvements include providing multiple electrodes to drive the gain medium of the semiconductor laser. These multiple electrodes correspond to different functions, including a 'pumping' function that provides the majority of the energy to pump the gain medium of the laser, and a 'switching' function that controls the timing of light emission from the laser by controlling the transparency of a 'switch' region of the laser.

At least one 'pump' electrode is used to inject a high current into a first region of the gain medium, providing the bulk of the energy that results in the laser pulse. At least one additional 'switch' electrode is operated to switch the laser pulse on and off by controlling the transparency or gain of a second region of the gain medium. Since this switch electrode only needs to inject sufficient current to result in the second region becoming transparent/high gain enough to permit efficient lasing across the entire gain medium, the switch current may be much less (e.g., one or more orders of magnitude less) than the current injected through the pump electrode. Accordingly, the current pulse applied to the switch electrode may be much shorter for a given pulse energy, than if the current necessary to result in the given pulse energy were to be injected via a single electrode.

Figure 4:
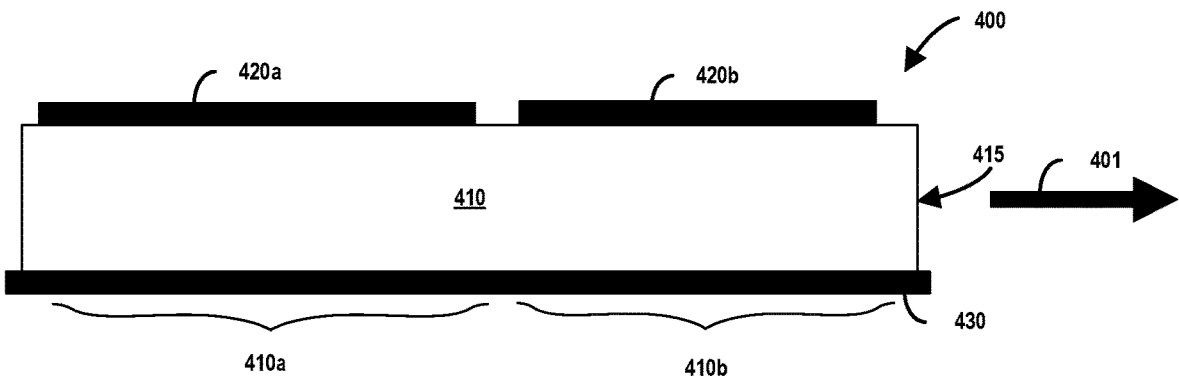
FIG. 4 is a cross-sectional illustration of elements of a semiconductor laser, according to example embodiments.

FIG. 4 illustrates, in a schematic cross-sectional view, an example semiconductor laser 400 configured in this manner. The semiconductor laser 400 includes a gain medium 410 that can be pumped, by injecting current into the gain medium 410, to result in the emission of coherent laser light through an output edge 415 of the gain medium 410. The direction of propagation of such emitted laser light is indicated in FIG. 4 by the arrow 401. The semiconductor laser 400 also includes a common electrode 430 (e.g., a cathode), a pump electrode 420*a* (e.g., a first anode), and a switch electrode 420*b* (e.g., a second anode). The electrodes could be composed of polysilicon, gold, or some other appropriate electrode material(s). Each of the electrodes could be composed of the same material, or one or more of the electrodes could differ with respect to material composition. The areas of the electrodes could be sized according to an application. For example, the pump electrode could have an area between 500 and 700 square microns (e.g., 600 square microns) and the switch electrode could have an area between 300 and 500 square microns (e.g., 400 square microns). The gain medium 410 itself could be composed of a III-V semiconductor material or some other material. For example, the gain medium 410 could include alternating layers of strained $In_{0.2}Ga_{0.8}As$ and GaAs. The gain medium 410 could include one or more quantum wells or other structures configured to facilitate the generation of laser light from charge carriers injected into the gain medium 410 from the electrodes 420*a*, 420*b*, 430. Current injected into the gain medium 410 through the pump electrode 420*a* is injected into a first portion 410*a* of the gain medium 410 and current injected into the gain medium 410 through the switch electrode 420*b* is injected into a second portion 410*b* of the gain medium 410.

With this arrangement of electrodes (and corresponding regions of the gain medium), the semiconductor laser 400 can be operated to efficiently generate relatively narrow pulses of high-energy laser light (e.g., pulses having widths less than 3 nanoseconds and pulse energies greater than 200 nanojoules, with peak pulse power greater than 100 watts). This can be achieved by applying a high current (e.g., more than 15 Amps) through the pump electrode 420*a* for a longer period of time and applying a lower current (e.g., less than 2 Amps) through the switch electrode 420*b* for a shorter period of time while the larger current is being applied through the pump electrode 420*a*. The timing of the emitted laser pulse corresponds to the timing of the pulse of current delivered through the switch electrode 420*b*. Since the current through the switch electrode only needs to be sufficient to bring the second region 410*b* of the gain medium 410 into a minimally supra-threshold gain/transparency state (e.g., to a state where the round trip gain exceeds the round trip losses or the laser threshold condition) to permit the laser 400 as a whole to begin lasing, the current through the switch electrode 420*b* can be much less than the current through the pump electrode 420*a*. Accordingly, the pulse of current applied through the switch electrode 420*b* can have a much shorter duration and/or a much shorter rise/fall time, given the limitations of inductance and/or capacitance in the circuit applying the current.

Figure 5:
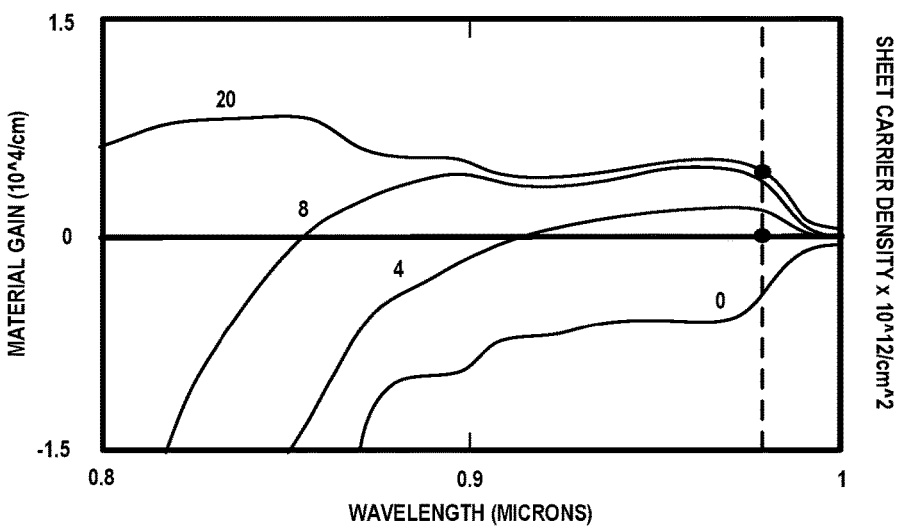
FIG. 5 is an illustration of the gain of an example gain medium as a function of applied current density and wavelength.

FIG. 5 illustrates an example chart of the relationship between injected current density and the gain of the gain medium of a semiconductor laser (in this example, the gain medium comprises a layer of $In_{0.2}Ga_{0.8}As$ between layers of GaAs forming at least one quantum well) as a function of wavelength. Each curve in the chart illustrates the gain of the gain medium (the vertical axis, in units of dimensionless gain factor per centimeter) as a function of wavelength (the horizontal axis, in units of microns) for a particular level of injected current density. The level of injected current density for each curve is indicated by the numerals next to each curve, in units of $10^{12}$ carriers per square centimeter. The 'threshold' current density for the switching portion 410*b* of the gain medium 410 for a particular wavelength of laser light is the current density necessary to result in an overall round-trip laser gain greater than the overall round-trip laser loss. For the wavelength indicated by the dashed line, this current density is less than $4\times10^{12}$ carriers per square centimeter (illustrated by the lower filled circle). The pump portion 410a of the gain medium 410 can then be provided with some substantially higher current, such as a current density corresponding to $20\times10^{12}$ carriers per square centimeter (illustrated by the upper filled circle), corresponding to the overall power of the laser light emitted from the laser 400 when the current density through the switching portion 410b is greater than the threshold current.

The majority of the energy of the laser pulse can be provided by the energy of the current injected through the pump electrode 420a. Since the timing of the emitted laser pulse is determined primarily by the timing of the current through the switch electrode 420b, the current waveform applied through the pump electrode 420a can have a much slower rise/fall time, longer pulse width, and/or a much higher amplitude. Accordingly, the total energy of laser pulses generated by the semiconductor laser 400 can be set essentially independently of the width and/or rise/fall times of the pulses of pump electrode current. During periods when current is injected through the pump electrode 420a but the laser 400 is not emitting laser light (e.g., due to the current through the switch electrode 420b being sub-threshold), some or all of the energy from that injected current may be dissipated as heat and/or as spontaneously emitted light generated in the pump portion 410a of the gain medium 410.

Figure 6:
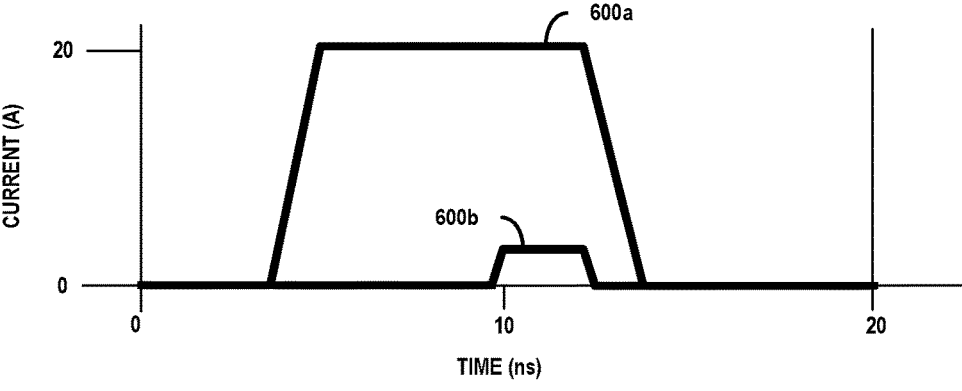
FIG. 6 is an illustration of current pulses applied through electrodes a semiconductor laser device, according to example embodiments.

FIG. 6 shows an example of current waveforms that could be applied through electrodes of a laser as described herein (e.g., through the pump 420a and switch 420b electrodes of the semiconductor laser 400). The vertical axis is current in units of Amps and the horizontal axis is time in units of nanoseconds. The pump electrode current 600a is provided as a higher-current, longer-duration pulse that has longer rise and fall times than the switch electrode current 600b, which has a shorter duration and shorter rise and fall times. Since the emission of laser light from the laser is determined primarily by whether the switch current is above a threshold level, the timing of the switch electrode current 600b thus controls the timing (including the duration and 'sharpness') of the emitted laser light pulse. Accordingly, in one example, the width of the laser pulse is less than 3 nanoseconds and the amplitude of the current provided to the switch electrode to generate the laser pulse is less than 25 milliamps. The ratio, during the emission of a laser pulse, between the amplitude of the current provided to the pump electrode and the amplitude of the current provided to the switch electrode could be high, e.g., greater than 10:1.

The geometry of the pump and switch electrodes can be adapted to a particular application. In some examples, the switch electrode may be disposed between the pump electrode and the edge of the laser through which laser light is emitted (e.g., as shown in FIG. 4). Alternatively, the pump electrode may be disposed between the switch electrode and the edge of the laser through which laser light is emitted. The absolute and/or relative areas or lengths, along the optical axis of the laser, of the pump and switch electrodes and/or the corresponding portions of the gain medium may be selected to provide the benefits described herein. For example, a ratio between the length and/or area of the pump electrode and the length and/or area of the switch electrode could be between 60:40 and 90:10, or could be even higher ratios. Such high ratios can allow the amount of current injected via the pump electrode to be increased while maintaining the density of the injected current below some threshold current density level. In some examples, the length and/or area of the switch electrode could be specified to be greater than a threshold level, based on the composition and geometry of the gain medium or other laser elements, to ensure that substantially no coherent laser light is emitted when the switch electrode current is at a low (or 'off') level while reducing the amplitude of the switch current required to result in emission of coherent laser light from the laser.

An additional benefit of decoupling the timing of the pump electrode current from the timing of the emitted laser pulse is the ability to control an amount of heating applied directly to the laser gain medium by controlling the amplitude and/or duration of current applied to the pump electrode. Since this current, during periods that the switch electrode current is sub-threshold, is largely decoupled from the timing or other properties of the coherent laser light emitted from the laser, it can be modulated to control the amount of heating applied to the laser gain medium without changing the timing of the emitted laser light pulses. Thus, the temperature of the gain medium can be controlled to a specified temperature and/or to within a specified range of temperatures by detecting the gain medium temperature and then controlling (e.g., increasing or decreasing) the amplitude and/or duration of currents applied to the pump electrode. This could be done to control the wavelength of the emitted laser light by, e.g., controlling the temperature of the gain medium such that a temperature-dependent emission spectrum of the gain medium has a maximum at a specified emission wavelength.

Another benefit of a laser as described herein is that the timing of application of large currents to the laser can be smoothed across time and/or across multiple lasers. The majority of the current is applied via the pump electrode, and can be applied regardless of whether the switch electrode is injecting current to fire the laser or not. Accordingly, the current-generation and/or pulse-forming circuitry for the pump electrode can be simplified and need not be as high-speed as if the laser had only one electrode. Further, this pump current circuitry could be shared across multiple lasers. For example, the output of the pump current generation circuitry can be applied in parallel to the pump electrodes of multiple different lasers (e.g., multiple different semiconductor lasers formed in a bar or other geometry on a single die of semiconductor material). This could simplify the packaging of such a multiple-laser assembly (e.g., by reducing the wire bonds necessary for the pump electrodes of the multiple lasers). Such an arrangement could also simplify power delivery to such a laser array, as the pump laser could be applied at a single level for a specified period of time substantially independent of which, or how many, of the individual lasers are firing at any particular time.

Note that the embodiments described herein, wherein a first portion of a gain medium is used to inject the majority of energy into the gain medium for generation of a pulse of a laser light and a second medium is used primarily to switch or gate the pulse of laser light while contributing less energy to the laser pulse, may be applied to types of lasers that are not semiconductor lasers. For example, a gas laser could include a gaseous gain medium. A first portion of this gaseous gain medium could be pumped (e.g., optically pumped) to contribute the majority of the energy in an emitted laser pulse. A second portion of the gaseous gain medium could then be pumped (e.g., optically pumped) with a substantially smaller amount of energy in a manner that controls the timing of the emitted laser pulse. In another example, the gain medium could be a crystal of Nd:YAG of a solid-state laser.

FIG. 7 is a flowchart diagram of a method 700, according to example embodiments. In some embodiments, one or more of the blocks of FIG. 7 may be performed by a computing device (e.g., a controller of a lidar device or other apparatus that includes a semiconductor laser, e.g., semiconductor laser 400). The computing device may include computing components such as a non-volatile memory (e.g., a hard drive or a read-only memory (ROM)), a volatile memory (e.g., a random-access memory (RAM), such as dynamic random-access memory (DRAM) or static random-access memory (SRAM)), a user-input device (e.g., a mouse or a keyboard), a display (e.g., an LED display or an LCD), and/or a network communication controller (e.g., a WIFI® controller, based on IEEE 802.11 standards, or an Ethernet controller). The computing device, for example, may execute instructions stored on a non-transitory, computer-readable medium (e.g., a hard drive) to perform one or more of the operations contemplated herein.

At block 702, the method 700 may include applying a first current through a pump electrode of a device. The device includes: (i) a gain medium that includes a III-V semiconductor material; (ii) a common electrode; and (iii) a switch electrode. The gain medium has an output edge through which photons generated in the gain medium can be emitted. The pump electrode is electrically coupled to a first portion of the gain medium and is configured to apply the first current through the first portion of the gain medium to provide energy for lasing. The common electrode is electrically coupled to the first portion of the gain medium and to a second portion of the gain medium. Either the (a) second portion of the gain medium is between the first portion of the gain medium and the output edge or (b) the first portion of the gain medium is between the second portion of the gain medium and the output edge. The switch electrode electrically coupled to the second portion of the gain medium and is configured to apply a current through the gain medium, thereby controlling a transparency of the second portion of the gain medium.

At block 704, the method 700 may include, while applying the first current through the pump electrode, applying a second current through the switch electrode. Applying the second current through the switch electrode includes controlling the second current between a low level and a high level. The low level causes the transparency of the second portion of the gain medium to be sufficiently low that most light generated in the first portion of the gain medium is not generated via coherent stimulated emission. The high level causes the transparency of the second portion of the gain medium to be sufficiently high that most light generated in the first portion of the gain medium is generated via coherent stimulated emission.

Such a device could be manufactured via a variety of processes and/or steps. For example, the materials of the common electrode, gain medium, and pump and switch electrodes, as well as other structures (e.g., insulating layers, quantum well(s) within the gain medium, intermediate layers to facilitate mechanical, thermal, and/or electrical coupling between neighboring layers and/or to facilitate formation of overlying layers via compatible processes) could be sequentially formed as a series of layers via physical vapor deposition, chemical vapor deposition, sputtering, spin coating, controlled oxidation, annealing, reactive ion etching, ion implantation, or some other processes. Subsequently and/or at one or more stages within such a sequential formation process, masks could be formed on and/or applied to the device under manufacture to facilitate the formation of patterned structures on or within the device, e.g., to etch away portions of a conductive layer in order to electrically separate the pump and switch electrodes from each other, to form electrical interconnects between elements of the device (e.g., between the pump and/or switch electrodes and bonding pads, between the pump electrode and pump electrodes of other lasers formed on the same die), or to form some other structures (e.g., to etch material between different individual devices formed on the same die in order to increase the electrical, thermal, and/or optical isolation between the distinct devices). Wire bonding or some other process could be used to electrically couple the device to pins, pads, or other electrical interconnects of a package and/or to a PCB or other substrate to which the device has been coupled.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The above detailed description describes various features and functions of the disclosed systems, devices, and methods with reference to the accompanying figures. In the figures, similar symbols typically identify similar components, unless context dictates otherwise. The example embodiments described herein and in the figures are not meant to be limiting. Other embodiments can be utilized, and other changes can be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

With respect to any or all of the message flow diagrams, scenarios, and flow charts in the figures and as discussed herein, each step, block, operation, and/or communication can represent a processing of information and/or a transmission of information in accordance with example embodiments. Alternative embodiments are included within the scope of these example embodiments. In these alternative embodiments, for example, operations described as steps, blocks, transmissions, communications, requests, responses, and/or messages can be executed out of order from that shown or discussed, including substantially concurrently or in reverse order, depending on the functionality involved. Further, more or fewer blocks and/or operations can be used with any of the message flow diagrams, scenarios, and flow charts discussed herein, and these message flow diagrams, scenarios, and flow charts can be combined with one another, in part or in whole.

A step, block, or operation that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical operations or actions in the method or technique. The program code and/or related data can be stored on any type of computer-readable medium such as a storage device including RAM, a disk drive, a solid state drive, or another storage medium.

Moreover, a step, block, or operation that represents one or more information transmissions can correspond to information transmissions between software and/or hardware modules in the same physical device. However, other information transmissions can be between software modules and/or hardware modules in different physical devices.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

What is claimed is:

1. A device comprising:

a gain medium, wherein the gain medium has an output edge through which photons generated in the gain medium can be emitted;

a common electrode electrically coupled to a first portion of the gain medium and to a second portion of the gain medium, wherein one of (i) the second portion of the gain medium is between the first portion of the gain medium and the output edge or (ii) the first portion of the gain medium is between the second portion of the gain medium and the output edge;

a pump electrode electrically coupled to the first portion of the gain medium, wherein the pump electrode is configured to apply a first current through the gain medium that provides energy for an emitted laser pulse;

a switch electrode electrically coupled to the second portion of the gain medium, wherein the switch electrode is configured to apply a second current through the gain medium, wherein the second current controls a transparency of the second portion of the gain medium such that the second current determines when the device begins emitting any laser light so as to control a duration of the emitted laser pulse; and a circuit electrically coupled to the common electrode, the pump electrode, and the switch electrode, wherein the circuit is configured to:

apply the first current through the pump electrode, wherein applying the first current comprises controlling an amplitude of the first current such that a temperature of the gain medium is maintained at a specified temperature or within a specified range of temperatures; and while applying the first current through the pump electrode, apply the second current through the switch electrode.

2. The device of claim 1, wherein applying the second current through the switch electrode comprises controlling the second current between a low level and a high level, wherein the low level causes the transparency of the second portion of the gain medium to be sufficiently low such that most light generated in the first portion of the gain medium is not generated via coherent stimulated emission, and wherein the high level causes the transparency of the second portion of the gain medium to be sufficiently high such that most light generated in the first portion of the gain medium is generated via coherent stimulated emission.

3. The device of claim 2, wherein a ratio between the first current and the high level of the second current is greater than 10:1.

4. The device of claim 2, wherein the high level of the second current is less than 25 milliamps.

5. The device of claim 2, further comprising:

an additional gain medium, wherein the additional gain medium has an output edge through which photons generated in the additional gain medium can be emitted;

an additional common electrode that is electrically coupled to the common electrode, to a first portion of the additional gain medium, and to a second portion of the additional gain medium, wherein one of (i) the second portion of the additional gain medium is between the first portion of the additional gain medium and the output edge of the additional gain medium or (ii) the first portion of the additional gain medium is between the second portion of the additional gain medium and the output edge of the additional gain medium;

an additional pump electrode that is electrically coupled to the pump electrode and to the first portion of the additional gain medium, wherein the additional pump electrode is configured to apply a current through the additional gain medium that provides energy for lasing; and an additional switch electrode electrically coupled to the second portion of the additional gain medium, wherein the additional switch electrode is configured to apply a current through the additional gain medium that controls a transparency of the second portion of the additional gain medium;

wherein the circuit is also coupled to the additional common electrode, the additional pump electrode, and the additional switch electrode, wherein the circuit applying the first current through the pump electrode comprises the circuit applying a combined current to the pump electrode and to the additional pump electrode, and wherein the circuit is additionally configured to:

while applying the first current through the pump electrode, apply a third current through the additional switch electrode, wherein applying the third current through the additional switch electrode comprises controlling the third current between a low level and a high level, wherein the low level of the third current causes the transparency of the second portion of the additional gain medium to be sufficiently low such that most light generated in the first portion of the additional gain medium is not generated via coherent stimulated emission, and wherein the high level of the third current causes the transparency of the second portion of the additional gain medium to be sufficiently high such that most light generated in the first portion of the additional gain medium is generated via coherent stimulated emission.

6. The device of claim 5, wherein the gain medium and the additional gain medium are part of a single die of semiconductor material.

7. The device of claim 1, wherein the circuit is additionally configured to:

detect the temperature of the gain medium.

8. The device of claim 1, wherein the specified temperature corresponds to a temperature at which a maximum of an emission spectrum of the gain medium corresponds to a specified emission wavelength.

9. The device of claim 1, wherein a ratio between an area of the pump electrode and an area of the switch electrode is between 60:40 and 90:10.

10. The device of claim 1, wherein a width of the emitted laser pulse is less than 3 nanoseconds.

11. The device of claim 1, wherein a pulse energy of the emitted laser pulse is greater than 200 nanojoules.

12. A semiconductor laser comprising:

a gain medium comprising a III-V semiconductor material, wherein the gain medium has an output edge through which photons generated in the gain medium can be emitted;

a common electrode electrically coupled to a first portion of the gain medium and to a second portion of the gain medium, wherein one of (i) the second portion of the gain medium is between the first portion of the gain medium and the output edge or (ii) the first portion of the gain medium is between the second portion of the gain medium and the output edge;

a pump electrode electrically coupled to the first portion of the gain medium, wherein the pump electrode is configured to apply a first current through the first portion of the gain medium, wherein the first current provides energy for an emitted laser pulse;

a switch electrode electrically coupled to the second portion of the gain medium, wherein the switch electrode is configured to apply a second current through the second portion of the gain medium, wherein the second current controls a transparency of the second portion of the gain medium such that the second current determines when the device begins emitting any laser light so as to control a duration of the emitted laser pulse; and a circuit electrically coupled to the common electrode, the pump electrode, and the switch electrode, wherein the circuit is configured to:

apply the first current through the pump electrode, wherein applying the first current comprises controlling an amplitude of the first current such that the temperature of the gain medium is maintained at a specified temperature or within a specified range of temperatures; and while applying the first current through the pump electrode, apply the second current through the switch electrode.

13. The semiconductor laser of claim 12, wherein applying the second current through the switch electrode comprises controlling the second current through the switch electrode between a low level and a high level, wherein the low level causes the transparency of the second portion of the gain medium to be sufficiently low that most light generated in the first portion of the gain medium is not generated via coherent stimulated emission, and wherein the high level causes the transparency of the second portion of the gain medium to be sufficiently high that most light generated in the first portion of the gain medium is generated via coherent stimulated emission.

14. The semiconductor laser of claim 13, wherein a ratio between the first current and the high level of the second current is greater than 10:1.

15. The semiconductor laser of claim 13, wherein the high level of the second current is less than 25 milliamps.

16. The semiconductor laser of claim 12, wherein the circuit is additionally configured to:

detect the temperature of the gain medium.

17. The semiconductor laser of claim 12, wherein a ratio between an area of the pump electrode and an area of the switch electrode is between 60:40 and 90:10.

18. The semiconductor laser of claim 12, wherein a width of the emitted laser pulse is less than 3 nanoseconds.

19. The semiconductor laser of claim 12, wherein a pulse energy of the emitted laser pulse is greater than 200 nanojoules.

20. The semiconductor laser of claim 12, wherein the gain medium comprises alternating layers of strained $In_{0.2}Ga_{0.8}As$ and GaAs.

\* \* \* \* \*